United States Patent
Fyfe

(10) Patent No.: US 9,133,814 B2
(45) Date of Patent: Sep. 15, 2015

(54) APPARATUS FOR CREATING ELECTRICITY FROM PRESSURE FLUCTUATIONS IN PIPES

(76) Inventor: Edward R. Fyfe, Del Mar, CA (US)

( * ) Notice: Subject to any disclaimer, the term of this patent is extended or adjusted under 35 U.S.C. 154(b) by 40 days.

(21) Appl. No.: 13/569,146

(22) Filed: Aug. 7, 2012

(65) Prior Publication Data

US 2014/0042751 A1    Feb. 13, 2014

(51) Int. Cl.
| | |
|---|---|
| F03B 13/00 | (2006.01) |
| H02N 2/18 | (2006.01) |
| H01L 41/08 | (2006.01) |
| H01L 41/083 | (2006.01) |
| H01L 41/113 | (2006.01) |
| H01L 41/18 | (2006.01) |

(52) U.S. Cl.
CPC ............. *F03B 13/00* (2013.01); *H01L 41/082* (2013.01); *H01L 41/0836* (2013.01); *H01L 41/113* (2013.01); *H01L 41/18* (2013.01); *H02N 2/185* (2013.01); *F05B 2220/20* (2013.01); *F05B 2220/709* (2013.01)

(58) Field of Classification Search
USPC ...................................... 290/53, 54; 310/339
See application file for complete search history.

(56) References Cited

U.S. PATENT DOCUMENTS

| | | | | |
|---|---|---|---|---|
| 6,011,346 | A * | 1/2000 | Buchanan et al. | 310/339 |
| 6,230,751 | B1 * | 5/2001 | Sjotun | 138/153 |
| 7,197,798 | B2 * | 4/2007 | Wilkie et al. | 29/25.35 |
| 7,429,801 | B2 | 9/2008 | Adamson et al. | |
| 7,696,634 | B2 | 4/2010 | Filardo | |
| 2009/0229696 | A1 * | 9/2009 | Warren | 138/98 |
| 2010/0019498 | A1 * | 1/2010 | Pollack et al. | 290/53 |
| 2010/0072859 | A1 | 3/2010 | Jager et al. | |
| 2010/0176692 | A1 | 7/2010 | Shmilovich et al. | |
| 2011/0194845 | A1 * | 8/2011 | Wang et al. | 392/468 |
| 2012/0032560 | A1 * | 2/2012 | Ochoa et al. | 310/339 |
| 2014/0034178 | A1 * | 2/2014 | Warren | 138/137 |

OTHER PUBLICATIONS

"A study of piezoelectric properties of carbon fiber reinforced concrete and plain cement paste during dynamic loading," Cement and Concrete Research 30 (2000) 1593-1595 (especially Fig. 2 and discussion on p. 1594).

* cited by examiner

*Primary Examiner* — Tulsidas C Patel
*Assistant Examiner* — Sean Gugger
(74) *Attorney, Agent, or Firm* — Palomar Patent; Mary Jo Redman

(57) ABSTRACT

Flexible pipe liner harvests energy from pressure fluctuations of a fluid in a pipe and converts it to electricity to power local sensors or other equipment. Pipe may be a pipeline for carrying water, sewage, or oil; or may be an open-ended segment suspended in a body of water. Pipe liner also serves to reinforce or repair a pipeline and is constructed of conventional materials.

6 Claims, 1 Drawing Sheet

APPARATUS FOR CREATING ELECTRICITY FROM PRESSURE FLUCTUATIONS IN PIPES

FIELD OF THE INVENTION

This invention relates generally to production of electricity and more particularly to production of electricity from pressure fluctuation in an enclosed fluid.

BACKGROUND OF THE INVENTION

A potential source of energy that has not been well utilized to date is harvesting of waste kinetic energy. An example of a good use of otherwise wasted energy is regenerative braking systems used in hybrid cars. Regenerative brakes transform the kinetic energy of the car into electricity that is stored in the battery.

Another potential type of waste energy is the kinetic energy of moving or pressurized fluids, in either a man-made or natural system.

Many attempts have been made to harvest electricity from the deformation of various flexible or stretchy membranes in contact with a moving or pressurized fluid, such as auto tires, a rubbery tube that is stretched by ocean waves, or leaf-like ribbons that undulate in a river. Piezoelectric material is in some manner attached to the flexible membrane to convert the bending or stretching motions directly into electricity.

For example, Adamson et al. in U.S. Pat. No. 7,429,801, issued Sep. 30, 2008, teach the use of commercially available piezoelectric fiber composite material in some detail.

Other attempts to generate electricity from the kinetic energy of moving water first convert the complex motions of the water into a simpler type of motion, such as that of a waterwheel, a piston, or an oscillating (but not stretchable) membrane. Then the rotary or linear motion is converted into electrical energy.

Auto tires produce only tiny amounts of electricity, such as enough to transmit data from an internal air pressure sensor. This is a useful, but very limited application. Other systems in the patent literature for generating larger amounts of electricity with stretchy membranes require dedicated, rugged apparatus fabricated from special materials. This also limits their usefulness because of the high costs of fabrication, permitting, and installation.

At least one pilot scale turbine has been placed in a municipal water main. This appears useful in certain cases where the water has far more energy than it needs to arrive at its ultimate destination, such as when water has been pumped over mountains then flows down by gravity. In the more typical case of water pressurized by a pump for the purpose of causing it to flow in a relatively level pipe, any apparatus that impedes the flow is probably not beneficial.

There is still a need for systems to harvest waste kinetic energy, such that from moving water, that do not impede the flow of the water. In the case of pumped water or other fluid, it is especially vital that energy is not actually "stolen" from the pump. There is further a need for energy harvesting systems that use conventional materials and construction techniques.

SUMMARY OF THE INVENTION

The present invention is an apparatus for creating electricity by converting pressure fluctuations in flowing fluids, such as the undesired pulses called "water hammer," into useful electrical current. The system generally includes a rigid pipe through which water or other liquid flows, flexible carbon fiber composite sheets lining the inner surface of the pipe, an isolator sheet between adjacent pairs of carbon sheets, and conductor elements to collect and conduct the generated electricity.

The pipe may be a water main conducting drinking or irrigation water, a sewage pipe, a pipeline for dumping treated industrial waste, a pipeline for petroleum or liquefied gas, or similar man-made pipe. The pipe may alternatively be an open-ended segment of pipe, such as a hollow cylindrical shell made from concrete or steel, that is submerged in a body of water, such as a river, waterfall, or ocean current.

The carbon fiber composite sheets are typically attached to the inner surface in multiple layers, which may be separated by isolator, i.e. dielectric, layers.

This laminated liner responds both to radial forces (substantially normal to the longitudinal axis of the pipe) and shear forces. A typical source of radial force is the periodic rapid fluctuation in pressure known as water hammer. Shear forces largely result from turbulence and friction. A benefit of the present invention is that the flexible liner damps the high pressure pulses so that damage to the interior of the pipe is decreased.

The present invention has a cost advantage over previous attempts to scavenge power from moving fluids by building special devices to place in a fluid. Existing large concrete or iron pipelines are commonly lined to repair damage to the pipeline and extend the useful life. The method and apparatus of the present invention can be easily adapted such that the liner also serves this repair function. By applying the energy conversion system to a pipeline already in need of repair lining, much of the expense of installing the energy conversion system is thus "paid for" by the needed repair process. A further advantage is that materials and automated equipment already developed for pipe repair can be employed in the practice of the present invention.

DETAILED DESCRIPTION OF THE INVENTION

Figure 1:
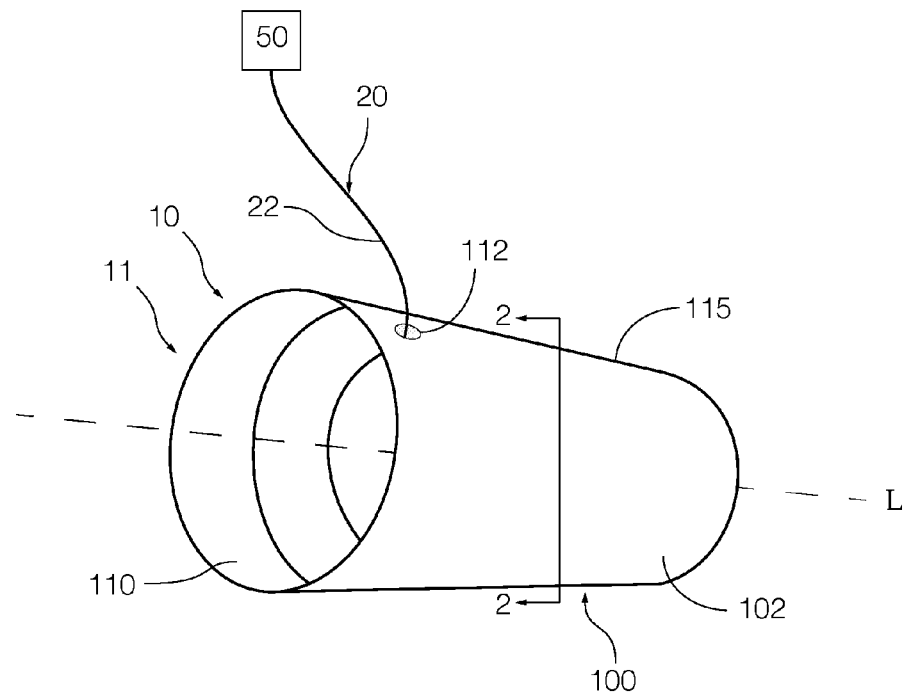
FIG. 1 is a diagrammatic representation of the present invention, showing the energy conversion apparatus of the present invention attached to a section of conventional pipe.

FIG. 1 shows the energy conversion apparatus 10 of the present invention, connected to a section of a conventional pipe 100 for conveying fluid such as pressurized drinking water.

Pipe 100 defines a hollow inner volume 110, through which a fluid (not shown) such as drinking water, air, sewage, or petroleum may be conveyed by gravity or by pumping means. Pipe 100 includes an inner surface 101 facing inner volume 110 and an outer surface 102. The fluid flows generally in the direction of pipe 100's longitudinal axis L.

Pipe 100 may be of indeterminate length, but is typically composed of pipe segments 115 that are two to ten times as long as their diameter. A pipe segment 115 is typically made from concrete or cast iron, but other materials are suitable. The inner diameter of pipe segment 115 is preferably greater than 12 inches but may be as much as several feet.

The elements of energy conversion apparatus 10 are usually attached to an individual pipe segment 115. If many pipe segments 115 are connected end-to-end to create a long pipe 100, the elements of energy conversion apparatus 10 of individual pipe segments 115 are also connected together to create a larger apparatus 10. Energy conversion apparatus 10 may be operated attached to a single pipe segment 115, although the electrical output naturally increases in proportion to the number of pipe segments 115 connected together.

Figure 2:
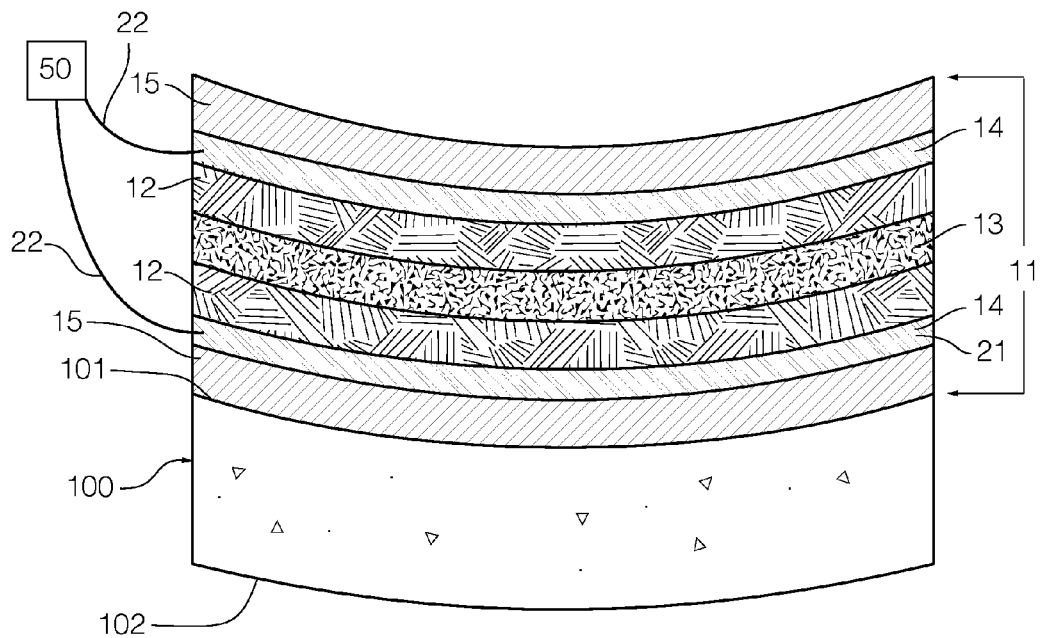
FIG. 2 is a partial sectional view, with vertical axis exaggerated, of the apparatus and pipe of FIG. 1 taken along line 2-2.

FIG. 2 is a sectional view, cut away and with vertical axis exaggerated for clarity, of apparatus 10 and pipe 100 of FIG. 1 taken along line 2-2.

Apparatus 10 includes pipe liner 11 attached to pipe inner surface 101. Pipe liner 11 typically includes at least one pair of electricity-producing layers, such as carbon fiber layers 12; and an isolator (dielectric) layer 13 between each pair of carbon fiber layers 12. Isolator layer 13 separates carbon fiber layers 12 both physically and electrically. Layers 12, 13 are preferably attached to inner surface 101 and to each other with suitable adhesive (not shown), typically an epoxy resin or a cementitious material such as grout or cement that is not degraded by the fluid conveyed by pipe 100. The adhesive typically penetrates the entire thickness of the carbon fiber layer and forms a matrix around the fibers.

It has been reported (Mingquing Sun, et al., *Cement and Concrete Research*) that carbon fiber embedded in cementitious material polarizes and creates electricity in response to deformation. Testing of the present invention has borne this out.

Apparatus 10 further includes collection means 20 for collecting and conducting the electricity produced by pipe liner 11. Collection means 20 typically includes collection conductors 21 attached to pipe liner 11 and an output cable 22 that connects collection conductors 21 to some device 50 for receiving the produced electricity.

Various types of collection conductors 21 for energy-harvesting installations are known in the art and include conductive fibers embedded in a matrix or woven into a layer and, as illustrated herein, a layer of conductive sheet material 14 such as thin metal foil. In the preferred embodiment illustrated, one pair of carbon fiber layers 12 are sandwiched between two conductor layers 14.

As shown in FIG. 2, the outermost layers of liner 11 are two insulator layers 15 that insulate liner 11 electrically and protect it from mechanical damage.

In a preferred embodiment, insulator layer 15 and conductor layer 14 are combined in a single sheet of metallized Mylar or the equivalent. Conductor layer 14 is the metallized face of the Mylar and insulator layer 15 is the Mylar base.

Next, a first carbon fiber layer 12 is attached over first conductor layer 14 by suitable adhesive means (not shown) such as grout or cement. Carbon fiber layer 12 may consist of a woven or knitted sheet of carbon fiber fabric or it may be created in situ by laying carbon fiber yarns closely together, typically in a helical pattern. Either method of lining pipe 100 may be done manually (in the case of a pipe 100 large enough for a person to enter) or by a machine that travels through pipe 100 either under its own power or by being drawn by a cable. Methods of lining a pipe are well known in the art.

If a second, or more, carbon fiber layers 12 are to be installed, an isolator layer 13 is attached over first carbon fiber layer 12. Isolator layer 13 is composed of a suitable material such as non-metallized Mylar, Teflon, porcelain, mica, or similar non-conductive material. Isolator layer 13 could be sprayed in place, or could be a separate film or panel that is attached over first carbon fiber layer 12. Isolator layer 13 is attached by a suitable adhesive such as cementitious material or polymeric resin. The choice of insulator material is determined by cost, durability, compatibility with the other materials, and degree of stiffness desired.

Electricity that is produced by carbon fiber layers 12 is collected by conductor layers 14A, B. Collection means 20 may be wires embedded alongside conductor layers 14, wires soldered or otherwise attached to conductor layers 14, or similar means as is known in the art. Collection conductors 21 lead the electrical current to output cables 22 and then to a device 50 that uses, stores, or modifies the electrical current. Output cables 22 are shown in FIG. 2 as connected to both carbon layers 12 of the pair to form a simple circuit with a device 50 that receives the generated electricity for conversion to DC current or for other use or modification.

Typically, the electrical current is brought outside of pipe 100 by the passage of output cables 22 through one or more apertures 112 provided in pipe 100 or pipe segment 115.

I claim:

1. In combination:
a rigid pipe for conducting pressurized liquid subject to turbulence or pressure fluctuation; the pipe defining a hollow inner volume for passage of the liquid; and
a pipe liner attached to the inner surface of said pipe, for converting kinetic energy to electrical energy; said liner including:
a first liquid-contacting layer of metallized plastic film disposed adjacent to said inner volume and a second layer of metallized plastic film disposed in contact with said rigid pipe;
at least one pair of piezoelectric graphite fiber sheets; and
an insulator layer between each said pair of piezoelectric sheets; said layers and sheets connected together with suitable adhesive; and
collection means for collecting electrical energy created by said pipe liner; said collection means including:
a collection portion attached to said pipe liner;
an output portion connected to a suitable device for using, storing, or modifying the created electrical energy.

2. The combination of claim 1, said graphite sheets comprising layers of graphite fabric.

3. The combination of claim 1, said collection portion comprising:
said first and second layers of metallized plastic film.

4. The combination of claim 1, said output portion comprising an elongate output cable with a first end attached to said collection portion and a second end attached to the suitable device for using, storing, or modifying the created electrical energy.

5. In combination:
pressurized water; and
a conversion apparatus for converting kinetic energy from said water into electrical energy; including:
a rigid elongate hollow shell; comprising:
an outer surface;
an inner surface defining a chamber through which said water moves; and
two open ends for allowing passage of water;
a liner attached to said inner surface for creating electricity in response to forces applied to said liner by said water; said liner including:
a first layer of metallized plastic film adjacent to and in contact with the pressurized water:
a second layer of metallized plastic film disposed in contact with said rigid pipe;
at least one pair of piezoelectric layers; with
at least one insulator layer between said pair of piezoelectric layers; and collection means for collecting electricity generated by said liner and delivering the electricity to a suitable device, for using, storing, or modifying the collected electrical energy.

6. The combination of claim 5, wherein each said piezoelectric layer comprises graphite fabric impregnated with resin.

* * * * *